US012787225B2

(12) United States Patent
Tunks et al.

(10) Patent No.: US 12,787,225 B2
(45) Date of Patent: Nov. 3, 2026

(54) CPU HEAT SINK DETECTION

(71) Applicant: Dell Products L.P., Round Rock, TX (US)

(72) Inventors: Eric Michael Tunks, Austin, TX (US); Bryan Robert Krueger, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 245 days.

(21) Appl. No.: 18/651,414

(22) Filed: Apr. 30, 2024

(65) Prior Publication Data

US 2025/0338448 A1 Oct. 30, 2025

(51) Int. Cl.
*H05K 7/20* (2006.01)
*G06F 1/20* (2006.01)

(52) U.S. Cl.
CPC ........... *H05K 7/2039* (2013.01); *G06F 1/206* (2013.01)

(58) Field of Classification Search
CPC .......... G06F 1/206; G06F 1/20; G06F 9/5094; H10W 40/228; H05K 7/2039; H05K 7/20436
See application file for complete search history.

(56) References Cited

U.S. PATENT DOCUMENTS 6,685,094 B2 * 2/2004 Cameron ......... G06K 19/06046 235/468
2009/0210190 A1 * 8/2009 Carlson .................. G01K 3/005 702/130
2009/0323288 A1 * 12/2009 Bernard .................... G06F 1/20 361/715
2014/0263662 A1 * 9/2014 Anagnostou ............. H01Q 1/44 235/492
2016/0081231 A1 * 3/2016 Berke ..................... G06F 1/206 361/679.54
2020/0174534 A1 * 6/2020 Ganta Papa Rao Bala ................ G06F 1/181
2023/0062807 A1 * 3/2023 Sun ........................ H01R 13/24

* cited by examiner

*Primary Examiner* — Mandeep S Buttar
(74) *Attorney, Agent, or Firm* — Fogarty LLP

(57) ABSTRACT

A circuit board with heat sink detection includes a computer-based component with a heat sink associated therewith. The heat sink has a specification and is configured with a unique key representative of the heat sink specification. A key reading device on the circuit board is configured to interact with the unique key and detect the heat sink specification. The key reading device may then transmit a signal indicating the heat sink specification.

20 Claims, 5 Drawing Sheets

CPU HEAT SINK DETECTION

BACKGROUND

A heat sink for a CPU (central processing unit) works by providing a large surface area to transfer heat away from the CPU. It is usually made of a metal such as aluminum or copper, which has high thermal conductivity, allowing heat to transfer efficiently from the CPU to the heat sink. The heat sink is mounted directly on top of the CPU, and a thin layer of thermal paste is often applied between the CPU and the heat sink to improve heat transfer.

Server platforms have many configuration options that require different geometry and performance for the CPU heat sinks. This could include higher performance for high power CPUs, or lower profile to allow for longer PCI cards (for example) where it may be desired to install a shorter heat sink with a CPU to accommodate a long PCI card.

However, a problem arises when installing heat sinks. The system does not know whether the correct heat sink is installed. For example, a 350 Watt CPU might require a 2U high performance heat sink. But, to accommodate a PCI card a 1U heat sink was inadvertently installed. There would be no indication that there is a mismatch until the CPU overheats.

A low-cost solution is needed to detect whether the correct heat sink is associated with the CPU.

SUMMARY

For purposes of summary, certain aspects, advantages, and novel features are described herein. It is to be understood that not necessarily all such advantages may be achieved in accordance with any one particular embodiment. Thus, the apparatuses or methods claimed may be embodied or carried out in a manner that achieves or optimizes one advantage or group of advantages as taught herein without necessarily achieving other advantages as may be taught or suggested herein.

A circuit board with heat sink detection includes a computer-based component with a heat sink associated therewith. The heat sink has a specification and is configured with a unique key representative of the heat sink specification. A key reading device on the circuit board is configured to interact with the unique key and detect the heat sink specification. The key reading device may then transmit a signal indicating the heat sink specification.

In one embodiment the unique key can be a mechanical key or an electronic key.

In embodiments where the unique key is an electronic key, the key may comprise a scannable code. In such case, the key reading device is an optical scanner.

In embodiments with the unique key is a mechanical key, the key can include one or more fingers, where the number and position of fingers represents the heat sink specification. In such case, the key reading device may be an array of contact pads where combinations of contact pads correspond to the heat sink specification.

A method for ensuring a heat sink of proper specification is associated with a computer-based component associated with a circuit board, the method comprising the steps of associating a unique key with a heat sink, the unique key being representative of the heat sink specification, and associating a key reading device with a circuit board where the key reading device is configured to interact with the unique key and detect the heat sink specification.

In some embodiments of this exemplary method, the key reading device is configured to transmit a signal indicative of the heat sink specification. In some embodiments, the key reading device transmits the signal to a board management controller.

BRIEF DESCRIPTION OF THE DRAWINGS

The present system is illustrated by way of example and is not limited by the accompanying figures. Elements in the figures are illustrated for simplicity and clarity and have not necessarily been drawn to scale. In the drawings, like reference numbers indicate identical or functionally similar elements. Additionally, the left-most digit(s) of a reference number identifies the drawing in which the reference number first appears.

DETAILED DESCRIPTION

The present disclosure is described with reference to the attached figures. The figures are not drawn to scale, and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Figure 1:
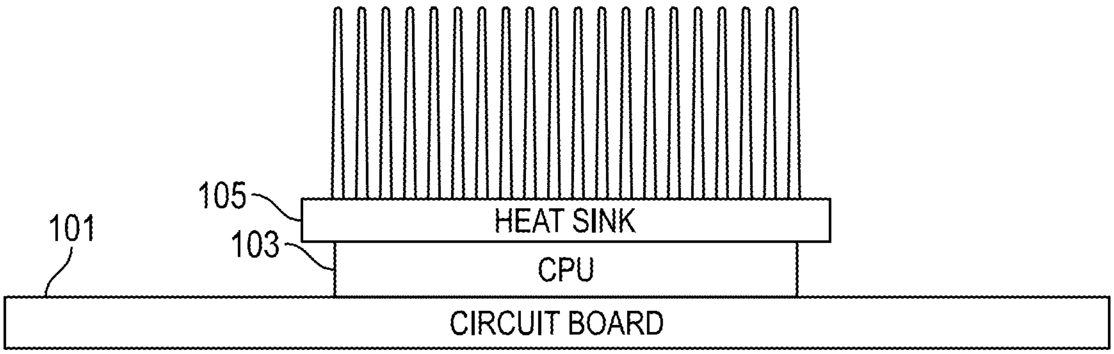
FIG. 1 is a side view of a circuit board with a CPU associated with a heat sink.

FIG. 1 is a side view of an exemplary circuit board 101 showing a typical arrangement of a computer-based component, e.g., a central processing unit (CPU) 103 supported by circuit board 101. A heat sink 105 is associated with CPU 103. Heat sink 105 is a passive cooling device that helps dissipate heat generated by the CPU 103 during operation.

Figure 2:
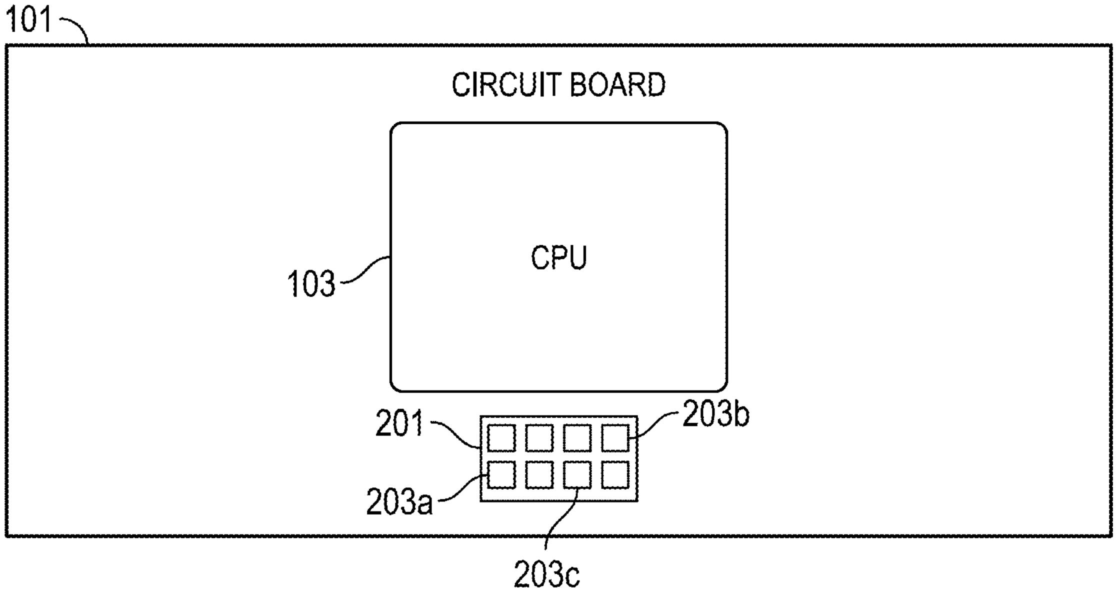
FIG. 2 is a top view of an exemplary circuit board with a CPU with a heat sink identifying array.

FIG. 2 shows a top view of a circuit board 101 according to a first embodiment of the disclosed method where a key reader 201 is attached to circuit board 101. Key reader 201 is configured with an array of contact pads 203*a-c* is associated with a resistive value and is further configured to issue a voltage signal based upon these resistive values. The array may be a one-dimensional array or a two-dimensional array.

Figure 3A:
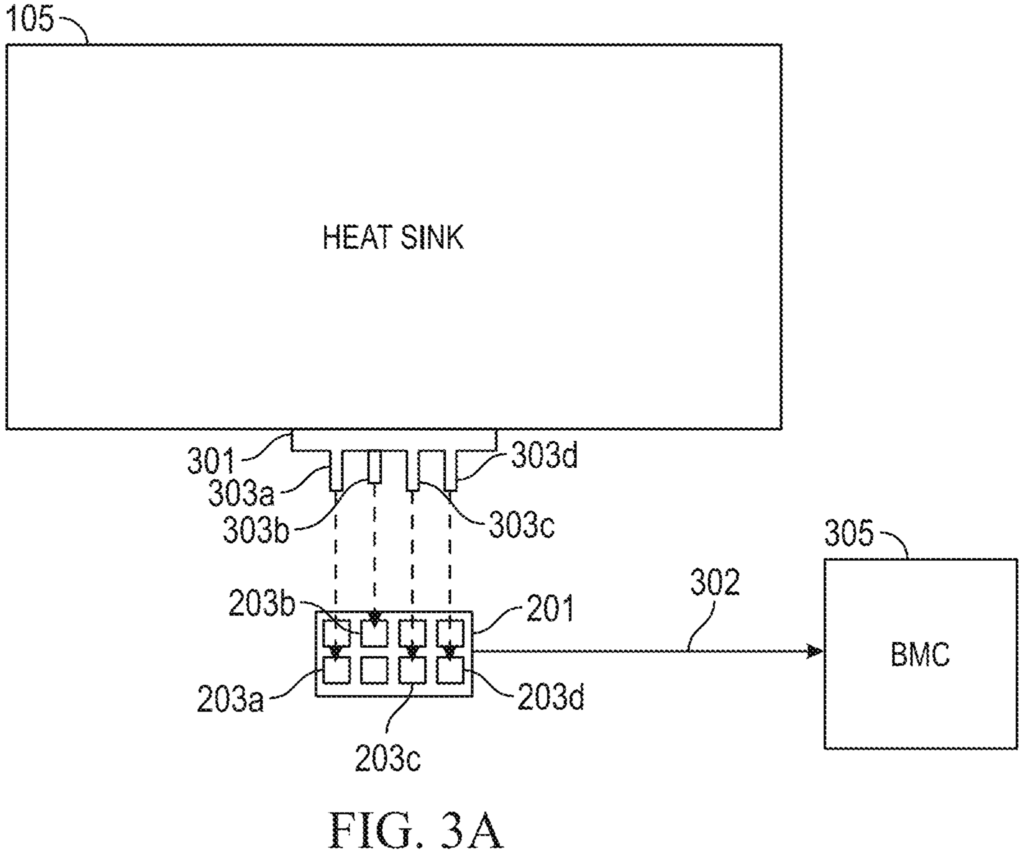
FIG. 3A depicts a heat sink associated with an exemplary heat sink identifying key.
Figure 4A:
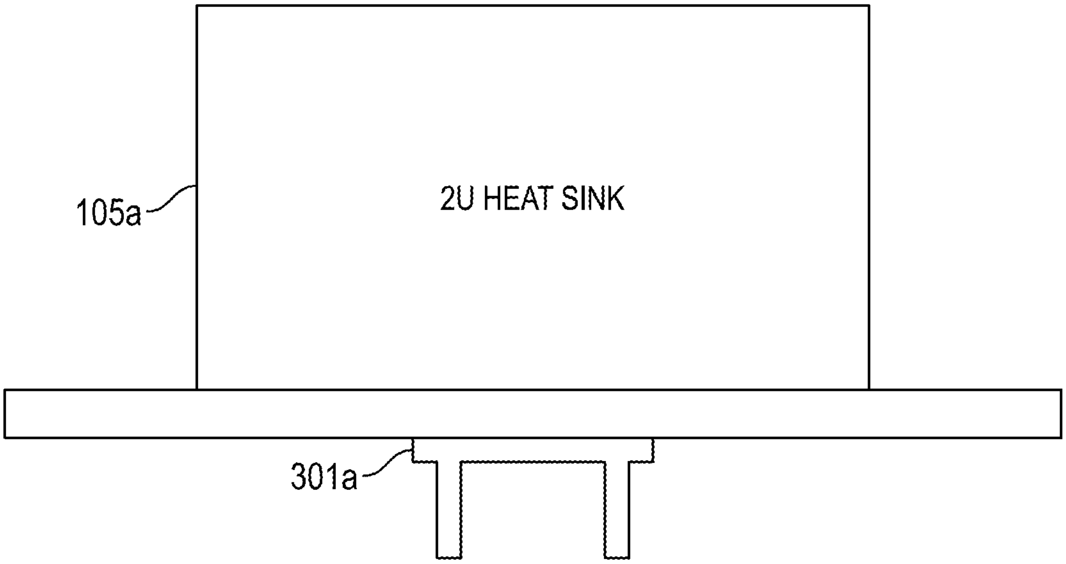
FIG. 4A depicts one type of heat sink with an exemplary unique identifying key.
Figure 4B:
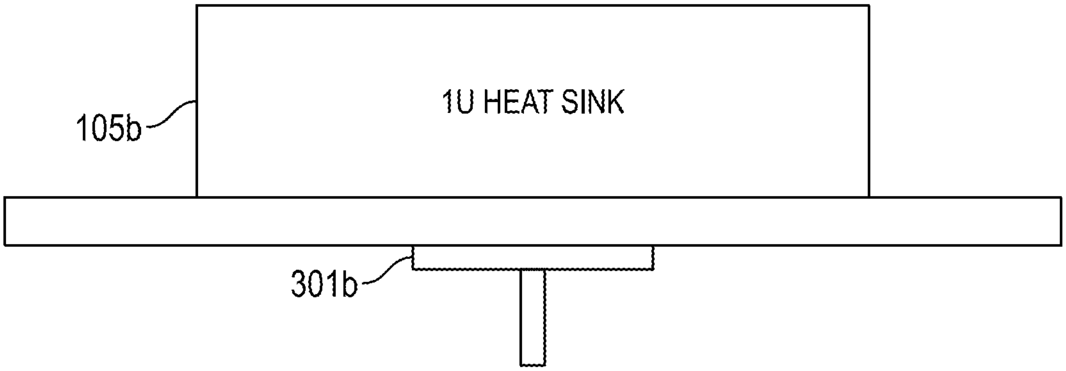
FIG. 4B depicts a second type of heat sink with a second exemplary unique identifying key.

Referring now to FIG. 3A, in a first embodiment, a heat sink 105 has a key 301 attached to its underside. The key comprises one or more pins 303*a-d* extending therefrom where each pin 303 is configured to engage one of the contact pads 203 of key reader 201. The number and position of pin(s) 303 represent the heat sink 105 specification. For example, In FIG. 4A, key 301*a* comprises two pins, spaced apart, which may represent a 2U high performance heat sink 105*a*. On the other hand, and referring to FIG. 4B, key 301*b* may be configured with one pin 303 extending from the center and represent a 1U standard heat sink 105*b* specification.

Figure 3B:
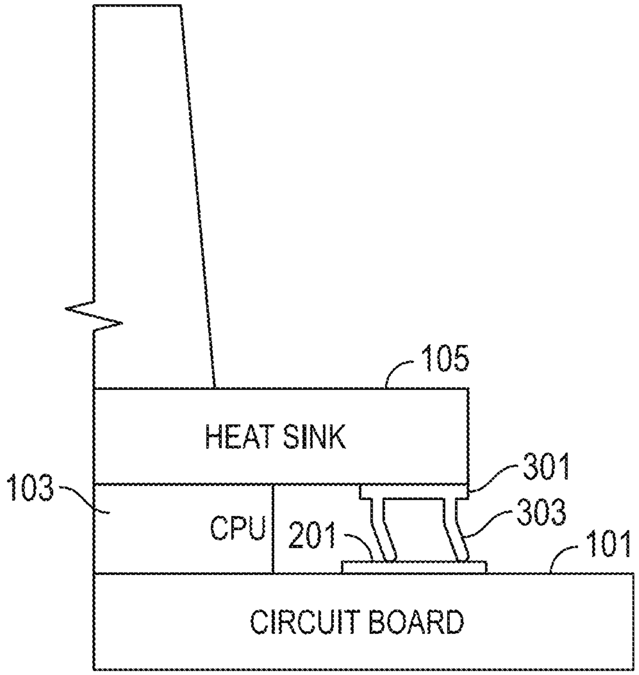
FIG. 3B is a partial side view of a circuit board with a CPU and an associated heat sink showing interaction of the heat sink identifying array with the heat sink identifying key.

Returning to FIG. 3A, key 301 comprises four pins 303*a-d*, with three pins 303*a*, 303*c*, 303*d* in one row and the fourth 303*b* in a second row. The position of the four pins is unique and represents the specification of heat sink 105. When heat sink 105 is installed with a CPU 103 (FIG. 3B), pins 303*a-d* contact corresponding pads 203*a-d* (FIG. 3A). Contact with the pads generates resistance values, the unique combination of which is representative of the specification of the heat sink 105. A voltage signal 302 representing a specification of heat sink 105 is received by a board management controller (BMC) 305. BMC 305 detects this voltage signal 302, and, accessing a look-up table, determine which heat sink 105 is installed. BMC 305 may also be configured to detect when a heat sink is not installed. BMC 305 is further configured to issue appropriate messages as to whether a proper heat sink 105 is installed, or whether one is installed at all.

Figure 5:
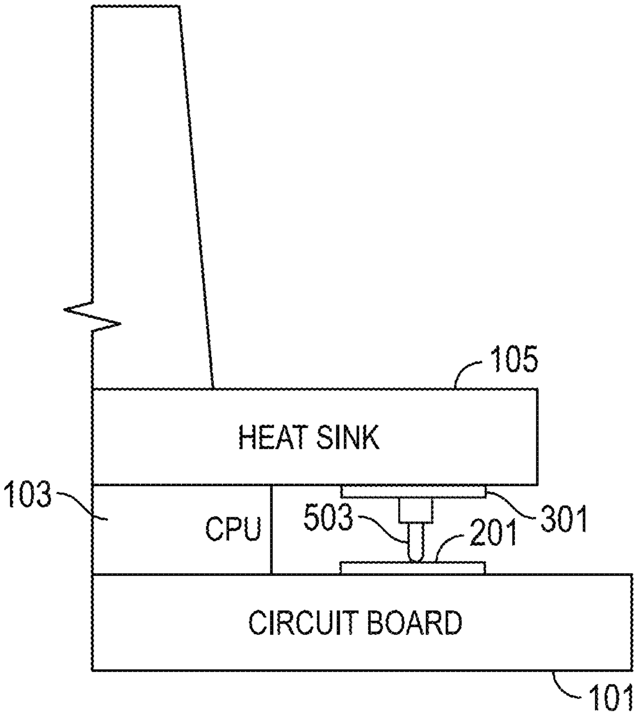
FIG. 5 illustrates another embodiment of an apparatus for identifying a heat sink.

As illustrated in FIG. 5, key 301 may comprise a pin 503 that may be a spring-biased, or "pogo pin." It will be appreciated that this is a mechanical method for detecting a proper CPU/heat sink combination. Electronic methods may be achieved as well.

Figure 6:
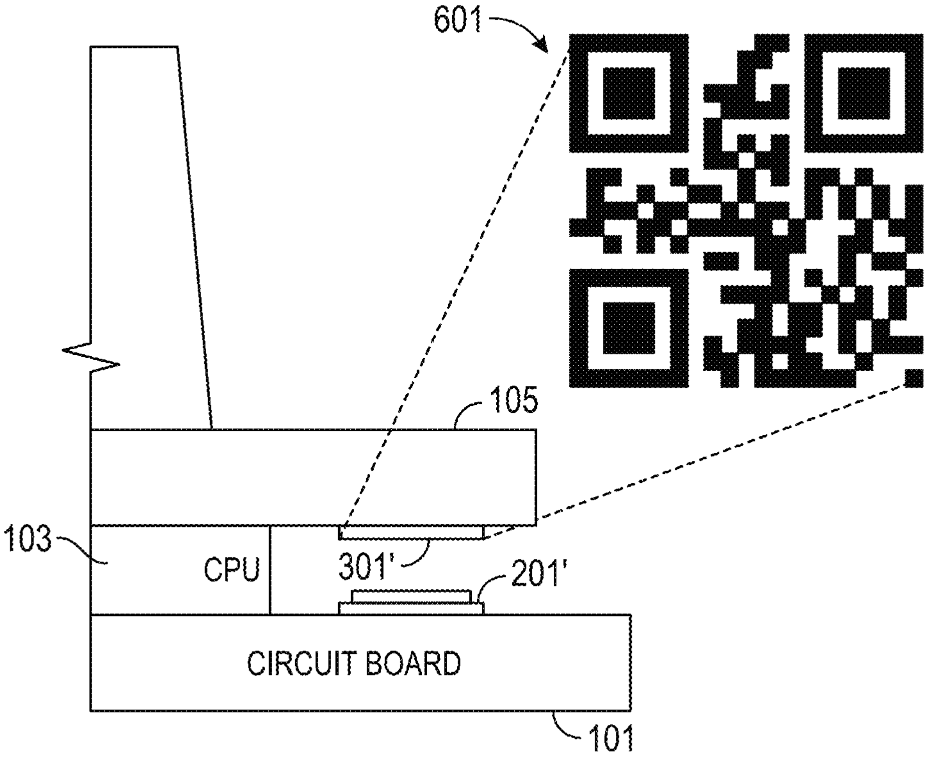
FIG. 6 illustrates a further embodiment of an apparatus for identifying a heat sink.
Figure 7:
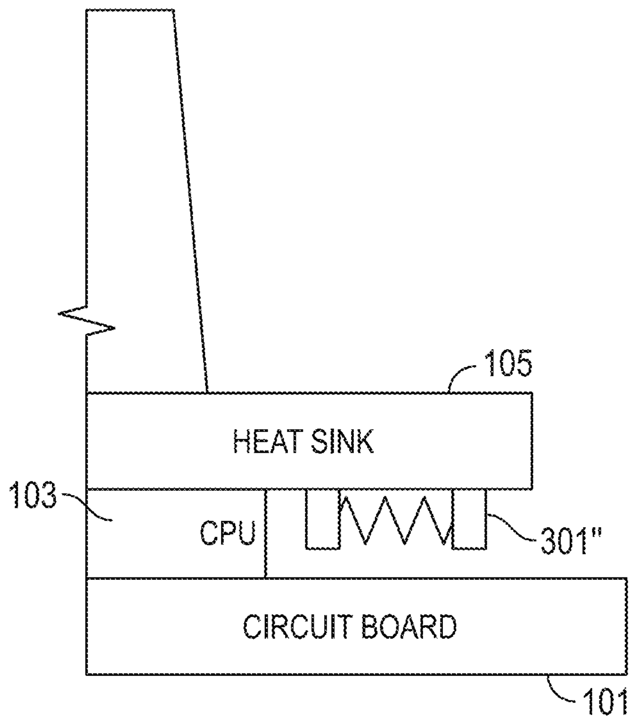
FIG. 7 illustrates yet another embodiment of an apparatus for identifying a heat sink.

For example, FIG. 6 shows a key 301' that comprises a unique optically scannable code 601, e.g., a quick response (QR) code, that represents the specification of heat sink 105. Key reader 201' in this instance is a device configured to scan the code 601 and transmit a signal to the BMC 305 indicating heat sink 105 specification. Another configuration for an electronic key system is depicted in FIG. 7 where key 301" attached to heat sink 105 comprises a unique resistive value depending on heat sink 105 specification. This resistive value may be read by a key reader (not shown) and the value relayed to the BMC 305.

In an example embodiment, a circuit board comprises a computer-based component, a heat sink having a specification, the heat sink associated with the computer-based component, the heat sink comprising a unique key representative of the heat sink specification; and a key reading device configured to interact with the unique key and detect the heat sink specification. The unique key is one of a mechanical key or an electronic key. The unique key may be an electronic key comprising a scannable code and the key reading device is an optical scanner. The unique key may be an electronic key comprising a resistance value where the resistance value is indicative of the heat sink specification. The unique key may be a mechanical key comprising one or more fingers, wherein the number and position of the one or more fingers represents the heat sink specification. The key reading device comprises an array of contact pads and wherein combinations of contact pads correspond to the heat sink specification.

In another example embodiment, a method ensures a heat sink of proper specification is associated with a computer-based component associated with a circuit board. The method comprises the steps of associating a unique key with a heat sink. The heat sink has a specification, wherein the unique key is representative of the heat sink specification. The method further comprises associating a key reading device with a circuit board. The key reading device is configured to interact with the unique key and detect the heat sink specification. The key reading device is configured to transmit a signal indicative of the heat sink specification. The method may further comprise the step of transmitting the signal to a board management controller. The unique key is one of a mechanical key and an electronic key. The unique key may be an electronic key comprising a scannable code and the key reading device is an optical scanner. The unique key may be an electronic key comprising a resistance value where the resistance value is indicative of the heat sink specification. The unique key may be a mechanical key comprising one or more fingers, wherein the number and position of the one or more fingers represents the heat sink specification. The key reading device may comprise an array of contact pads and wherein combinations of contact pads correspond to the heat sink specification. The key reading device may be configured to transmit a signal indicative of the heat sink specification. The method may further comprise the step of transmitting the signal to a board management controller.

The CPU and heat sinks described herein may be components of an information handling system IHS. An IHS may be a single-processor system, or a multi-processor system including two or more processors. Host processors on the IHS may include any processor capable of executing program instructions, such as an INTEL/AMD x86 processor, or any general-purpose or embedded processor implementing any of a variety of Instruction Set Architectures (ISAs), such as a Complex Instruction Set Computer (CISC) ISA, a Reduced Instruction Set Computer (RISC) ISA (e.g., one or more ARM core(s), or the like). The IHS may include a chipset coupled to the host processors. The chipset may provide host processors with access to several resources on the IHS. In some cases, the chipset may utilize a QuickPath Interconnect (QPI) bus to communicate with the host processors. The chipset may also be coupled to communication interfaces to enable communications between the IHS and various wired and/or wireless networks, such as ETHERNET, WIFI, BLUETOOTH (BT), cellular or mobile networks (e.g., Code-Division Multiple Access or "CDMA," Time-Division Multiple Access or "TDMA," Long-Term Evolution or "LTE," etc.), satellite networks, or the like.

The IHS may assume different form factors including, but not limited to: servers, workstations, desktops, laptops, appliances, video game consoles, tablets, smartphones, etc. For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price.

An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

In another example embodiment, an apparatus comprises a heat sink having one or more finger features extending downward toward a circuit board, wherein a number and configuration of the one or more finger features provides information about the heat sink, and one or more pads mounted on a surface of the circuit board, the pads positioned to contact the one or more finger features. The one or more finger features are electrically conductive and complete a circuit when in contact with the one or more pads. The one or more pads have a unique resistor value and are connected to a voltage. The one or more finger features may comprise a spring-loaded moveable pin element configured to contact the one or more pads. The heat sink may be mounted on a CPU in an IHS.

After a heat sink has been identified based upon the number and configuration of pins that contact the pads, information about the performance of the identified heat sink is obtained, such as from a database or list stored on the CPU to which the heat sink is attached or on a baseboard management controller (BMC). The heat sink performance information along with a fan speed used to cool the CPU can be monitored to instantaneously determine a current thermal performance of the CPU cooling solution.

Although the devices and methods are described herein with reference to specific embodiments, various modifications and changes can be made without departing from the scope of the present invention, as set forth in the claims below. Accordingly, the specification and figures are to be regarded in an illustrative rather than a restrictive sense, and all such modifications are intended to be included within the scope of any invention appertaining thereto. Any benefits, advantages, or solutions to problems that are described herein with regard to specific embodiments are not intended to be construed as a critical, required, or essential feature or element of any or all the claims.

Unless stated otherwise, terms such as “first” and “second” are used to arbitrarily distinguish between the elements such terms describe. Thus, these terms are not necessarily intended to indicate temporal or other prioritization of such elements. The terms “coupled” or “operably coupled” are defined as connected, although not necessarily directly, and not necessarily mechanically. The terms “a” and “an” are defined as one or more unless stated otherwise. The terms “comprise” (and any form of comprise, such as “comprises” and “comprising”), “have” (and any form of have, such as “has” and “having”), “include” (and any form of include, such as “includes” and “including”) and “contain” (and any form of contain, such as “contains” and “containing”) are open-ended linking verbs. As a result, a system, device, or apparatus that “comprises,” “has,” “includes” or “contains” one or more elements possesses those one or more elements but is not limited to possessing only those one or more elements. Similarly, a method or process that “comprises,” “has,” “includes” or “contains” one or more operations possesses those one or more operations but is not limited to possessing only those one or more operations.

What is claimed is:

1. A circuit board comprising:

a computer-based component;

a heat sink having a heat sink specification, the heat sink associated with the computer-based component, the heat sink comprising a unique key attached to the heat sink, wherein the unique key comprises a resistance value and is representative of the heat sink specification; and a key reading device configured to interact with the unique key and detect the heat sink specification.

2. The circuit board of claim 1, wherein the unique key is one of a mechanical key and an electronic key.

3. The circuit board of claim 2, wherein the unique key is an electronic key comprising a scannable code and the key reading device is an optical scanner.

4. The circuit board of claim 2, wherein the unique key is an electronic key comprising the resistance value where the resistance value is indicative of the heat sink specification.

5. The circuit board of claim 2, wherein unique key is a mechanical key comprising one or more fingers, wherein the number and position of the one or more fingers represents the heat sink specification.

6. The circuit board of claim 5, wherein the key reading device comprises an array of contact pads and wherein combinations of contact pads correspond to the heat sink specification.

7. A method for ensuring a heat sink of proper specification is associated with a computer-based component associated with a circuit board, the method comprising the steps of:

associating a unique key attached to a heat sink with the heat sink, the heat sink having a heat sink specification, the unique key comprising a resistance value and being representative of the heat sink specification; and associating a key reading device with a circuit board, the key reading device configured to interact with the unique key and detect the heat sink specification.

8. The method of claim 7, wherein the key reading device is configured to transmit a signal indicative of the heat sink specification.

9. The method of claim 8, further comprising the step of transmitting the signal to a board management controller.

10. The method of claim 7, wherein the unique key is one of a mechanical key and an electronic key.

11. The method of claim 10, wherein the unique key is an electronic key comprising a scannable code and the key reading device is an optical scanner.

12. The method of claim 10, wherein the unique key is an electronic key comprising the resistance value where the resistance value is indicative of the heat sink specification.

13. The method of claim 10, wherein unique key is a mechanical key comprising one or more fingers, wherein the number and position of the one or more fingers represents the heat sink specification.

14. The method of claim 13, wherein the key reading device comprises an array of contact pads and wherein combinations of contact pads correspond to the heat sink specification.

15. The method of claim 14, wherein the key reading device is configured to transmit a signal indicative of the heat sink specification.

16. The method of claim 15, further comprising the step of transmitting the signal to a board management controller.

17. An apparatus, comprising:

a heat sink having a unique key attached to the heat sink, the unique key comprising a resistance value and one or more finger features extending downward toward a circuit board, wherein a number and configuration of the one or more finger features provides information about the heat sink; and one or more pads mounted on a surface of the circuit board, the one or more pads positioned to contact the one or more finger features.

18. The apparatus of claim 17, wherein the one or more finger features are electrically conductive and complete a circuit when in contact with the one or more pads.

19. The apparatus of claim 18, wherein each of the one or more pads have a unique resistor value and are connected to a voltage.

20. The apparatus of claim 17, wherein the one or more finger features comprise a spring-loaded moveable pin element configured to contact the one or more pads.

* * * * *